US012777678B2

(12) United States Patent
Cho et al.

(10) Patent No.: US 12,777,678 B2
(45) Date of Patent: Oct. 27, 2026

(54) SPACE-FREE VERTICAL FIELD EFFECT TRANSISTOR INCLUDING ACTIVE LAYER HAVING VERTICALLY GROWN CRYSTAL GRAINS

(71) Applicant: Research & Business Foundation SUNGKYUNKWAN UNIVERSITY, Suwon (KR)

(72) Inventors: Hyung Koun Cho, Suwon (KR); Sung Hyeon Jung, Hwaseong (KR); Young Been Kim, Ansan (KR); Dong Su Kim, Yongin (KR); Ji Sook Yang, Suwon (KR)

(73) Assignee: RESEARCH & BUSINESS FOUNDATION SUNGKYUNKWAN UNIVERSITY, Suwon (KR)

( * ) Notice: Subject to any disclaimer, the term of this patent is extended or adjusted under 35 U.S.C. 154(b) by 847 days.

(21) Appl. No.: 17/964,557

(22) Filed: Oct. 12, 2022

(65) Prior Publication Data

US 2023/0118661 A1 Apr. 20, 2023

(30) Foreign Application Priority Data

Oct. 12, 2021 (KR) ........................ 10-2021-0135093

(51) Int. Cl.
*H10D 30/67* (2025.01)
*H10D 84/85* (2025.01)
(Continued)

(52) U.S. Cl.
CPC ..... *H10D 30/6728* (2025.01); *H10D 30/6755* (2025.01); *H10D 84/85* (2025.01);
(Continued)

(58) Field of Classification Search
CPC ........... H10D 30/6728; H10D 30/6755; H10D 84/85; H10D 99/00; H10D 84/02;
(Continued)

(56) References Cited

U.S. PATENT DOCUMENTS

| | | | | |
|---|---|---|---|---|
| 2007/0194380 A1* | 8/2007 | Okushima | ............ | H10D 89/611 257/E29.327 |
| 2011/0127522 A1* | 6/2011 | Yamazaki | ......... | H01L 21/02667 257/E29.095 |
| 2020/0044095 A1* | 2/2020 | Wang | .................. | H10D 86/421 |

FOREIGN PATENT DOCUMENTS

| | | |
|---|---|---|
| JP | 2016157974 | 9/2016 |
| KR | 20010034186 A | 4/2001 |

(Continued)

*Primary Examiner* — Brian Turner
*Assistant Examiner* — Zhijun Xu
(74) *Attorney, Agent, or Firm* — LEX IP MEISTER, PLLC

(57) ABSTRACT

A vertical field effect transistor according to an embodiment of the present invention does not require a spacer and, accordingly, remarkably alleviates the problem that electric charge is scattered at an interface, thereby having excellent electrical characteristics. The vertical field effect transistor includes a substrate, a source electrode positioned on the substrate, an active layer positioned on the source electrode and having vertically grown crystal grains, a drain electrode positioned on the active layer to be spaced by the active layer away from the source electrode, a gate insulating layer positioned on a lateral surface of the active layer, and a gate electrode positioned on the gate insulating layer.

6 Claims, 14 Drawing Sheets

(51) Int. Cl.
*H10D 99/00* (2025.01)
*H10P 14/20* (2026.01)
*H10P 14/26* (2026.01)

(52) U.S. Cl.
CPC ............. *H10D 99/00* (2025.01); *H10P 14/26* (2026.01); *H10P 14/3434* (2026.01)

(58) Field of Classification Search
CPC .. H10D 62/117; H10D 62/151; H10D 64/252; H10D 30/031; H01L 21/02565; H01L 21/02623; H01L 21/02425; H01L 21/02414; H01L 21/02483; H01L 21/02491; H01L 21/02554; H01L 21/02595; H01L 21/02628; H10P 14/26; H10P 14/3434; H10P 14/2918; H10P 14/3234; H10P 14/265; H10P 14/2923; H10P 14/3241; H10P 14/3426; H10P 14/3456
See application file for complete search history.

(56) References Cited

FOREIGN PATENT DOCUMENTS

| | | |
|---|---|---|
| KR | 20140145467 | 12/2014 |
| KR | 20150130566 | 11/2015 |
| KR | 101759255 | 7/2017 |

* cited by examiner

[Conventional vertical TFT structure]

[Spacer-free vertical TFT structure]

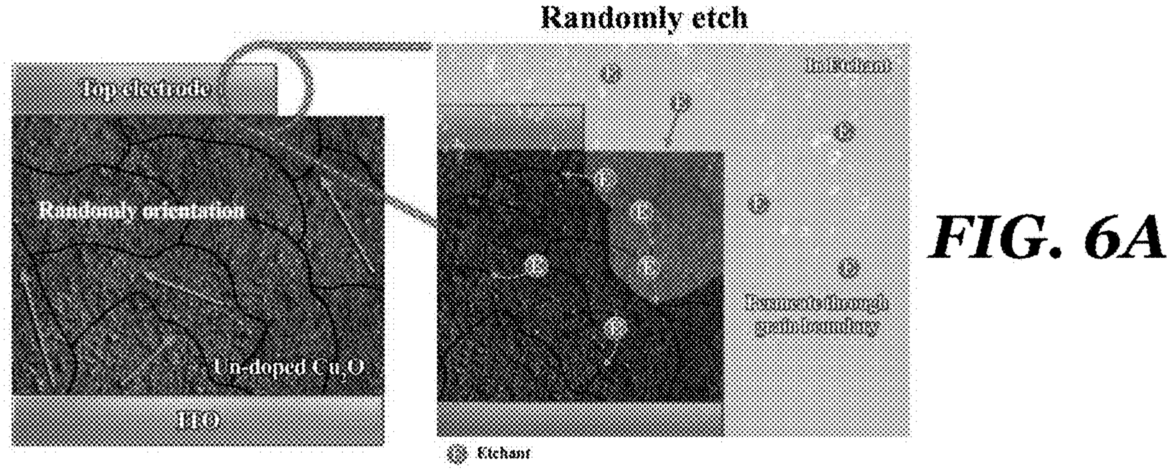
FIG. 6A
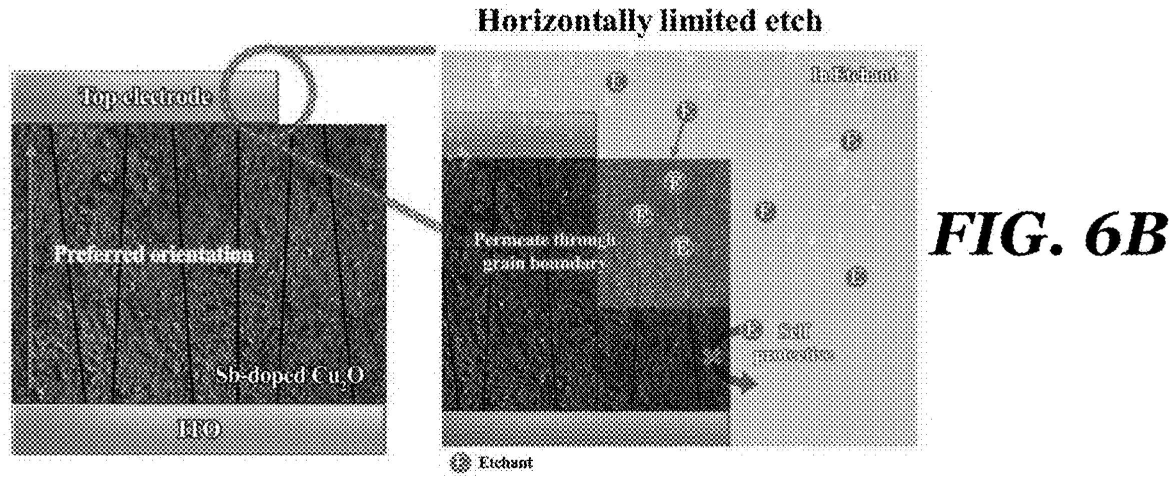
FIG. 6B
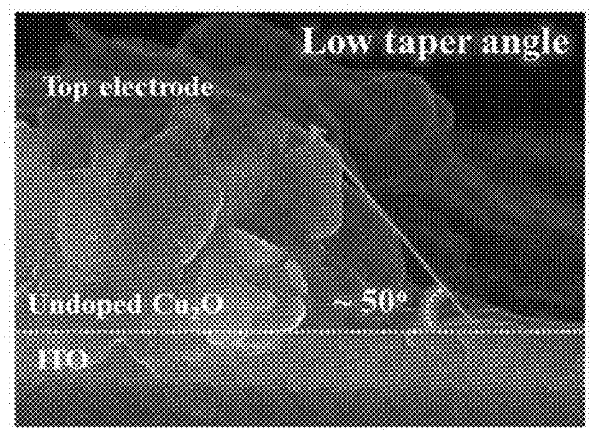
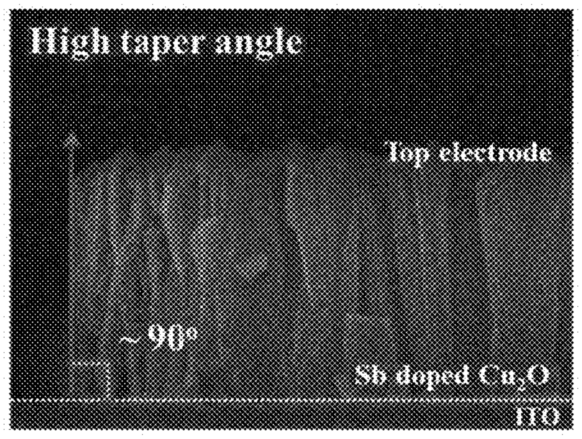
FIG. 6C
FIG. 6D

SPACE-FREE VERTICAL FIELD EFFECT TRANSISTOR INCLUDING ACTIVE LAYER HAVING VERTICALLY GROWN CRYSTAL GRAINS

CROSS REFERENCE TO RELATED APPLICATION

The present application claims priority to Korean Patent Application No. 10-2021-0135093, filed Oct. 12, 2021, the entire contents of which is incorporated herein for all purposes by this reference.

BACKGROUND OF THE INVENTION

Field of the Invention

The present invention relates to a field effect transistor and, more particularly, to a field effect transistor that employs an active layer having vertically grown crystal grains and a vertical structure, thereby eliminating the need for a space necessarily required of a vertical field effect transistor in the relate art.

Description of the Related Art

With the trend toward miniaturization of an electronic device and large-scale integration of components, there is also a demand for miniaturization of an element and for large-scale integration of elements. In order to meet this demand, progress has been continuously made in the development of transistors. Vertical field effect transistors have been developed in order to overcome the limitations of horizontal field effect transistors in the related art.

In the vertical field effect transistor, a channel that is vertically formed in such a manner as to extend from a source region to a drain region. A feature of the vertical field effect transistor is that a length of the channel is easily adjusted. Electrical characteristics of a transistor in the related art can be improved by reducing the length of the channel.

An initial structure of the vertical field effect transistor is a structure in which a drain electrode is positioned above a source electrode in a manner that the drain electrode is spaced by a spacer away from the source electrode and in which a channel positioned a sidewall connect the source electrode and the drain electrode.

The initial vertical field effect transistor requires the spacer that electrically insulates the source electrode and the drain electrode from each other. However, usually, the space is formed of a material that is very difficult to etch, and therefore, the use of a dry-etching technique for etching causes many problems. Typically, a low selection ratio and low-quality etching cause problems, such as an interfacial defective and an inclined sidewall. Consequently, due to these problems, an element has insufficient performance.

For example, in a junction field effect transistor including a planar substrate formed of a non-conductive material and having a vertical structure, disclosed in Korean Patent Application Publication No. 10-2001-0034186, a conductive material layer including a first electrode is provided on the substrate, an insulating material layer forming a first insulator is provided on the first electrode, a conductive material layer forming a second electrode is provided on the first insulator, another insulating material layer forming a second insulator is provided on the second electrode, a conductive material layer forming a third electrode is provided on the second insulator, the first electrode and the third electrode include drain and source electrodes, respectively, of the transistor, or vice versa, the second electrode includes a gate electrode of the transistor, at least one of the second electrode, the third electrode, the first insulator, and the second insulator that constitute a stacked structure forms a step that is oriented vertically with respect to the first electrode and/or the substrate, a semiconductor material forming an active semiconductor of the transistor is provided on exposed portions of the first electrode, the second electrode, and the third electrode, and the active semiconductor is brought into direct contact with the gate electrode, thereby forming a transistor channel that is oriented vertically, between the first electrode and the third electrode. The channel of this junction field effect transistor has a shorter length than that of the horizontal field effect transistor in the related art. However, as described above, since the space is required, the problem of the included sidewall and the problem of the interfacial defective cannot be solved.

Therefore, there is an urgent need to develop technologies for the vertical field effect transistor that has a structural advantage over the horizontal field effect transistor, that is capable of solving the problem of the interfacial defective and problems of electrical characteristics associated with the interfacial defective, and that is capable of being mass-produced through a simple process.

DOCUMENTS OF RELATED ART (Patent Document 1) Korean Patent Application Publication No. 10-2001-0034186

SUMMARY OF THE INVENTION

An object of the present invention, which is made to solve the above-mentioned problems, is to provide a vertical field effect transistor that is capable of solving the difficulty of etching that occurs due to a structural feature of the vertical field effect transistor that requires a space, the problem that electric charge is scattered at an interface, and the problem that a sidewall is unintendedly inclined.

Another object of the present invention is to provide a vertical field effect transistor that is capable of solving the problem that an electrochemical deposition technique is impossible to use in a vertical field effect transistor in the related art and the problem that an angle of a sidewall of the vertical field effect transistor is difficult to control when forming the sidewall thereof, and at the same time is capable of also performing simple and high-quality etching during an etching process.

The present invention is not limited to the above-mentioned objects. From the following description, an object not mentioned above would be understandable to a person of ordinary skill in the art to which the present invention pertains.

In order to accomplish the above-mentioned objects, according to an aspect of the present invention, there is provided a vertical field effect transistor.

The vertical field effect transistor includes: a substrate; a source electrode positioned on the substrate; an active layer positioned on the source electrode and having vertically grown crystal grains; a drain electrode positioned on the active layer in such a manner that the drain electrode is spaced away from the source electrode by the active layer; a gate insulating layer positioned on a lateral surface of the active layer; and a gate electrode positioned on the gate insulating layer.

In the vertical field effect transistor, the gate insulating layer may be positioned between the source electrode and the gate electrode, between the active layer and the gate electrode, and between the drain electrode and the gate electrode.

In the vertical field effect transistor, the active layer may contain a p-type oxide semiconductor.

In the vertical field effect transistor, the active layer may contain one or more selected from the group consisting of $Cu_2O$, ZnO, $SnO_2$, SnO, $In_2O_3$, $Zn_2SnO_4$, $InGaZnO_4$, $In_2Zn_3O_6$, $Zn_2SnO_4$, $ZnGa_2O_4$, $InGaO_3$, $In_2O_3$, $Ga_2O_3$, and a combination thereof.

In the vertical field effect transistor, the active layer may have a thickness that is more than 0.5 μm and equal to or less than 2.0 μm.

According to another aspect of the present invention, there is provided a method of manufacturing a vertical field effect transistor.

The method includes forming a source electrode on a substrate; forming an active layer having columnar bundle-type grains on the source electrode using an electrochemical deposition technique; forming a drain electrode on the active layer; performing selective etching; forming a gate insulating layer on a lateral surface of the active layer; and forming a gate electrode on the gate insulating layer.

In the method, in the forming of the active layer, the electrochemical deposition technique may be used for an oxide semiconductor that is doped with a metal.

In the method, the metal with which the oxide semiconductor is doped may contain one or more selected from the group consisting of Sb, Pb, Ni, Cr, Co, Mn, and a combination thereof.

In the method, the oxide semiconductor may contain one or more selected from the group consisting of $Cu_2O$, ZnO, $SnO_2$, SnO, $In_2O_3$, $Zn_2SnO_4$, $InGaZnO_4$, $In_2Zn_3O_6$, $Zn_2SnO_4$, $ZnGa_2O_4$, $InGaO_3$, $In_2O_3$, $Ga_2O_3$, and a combination thereof.

In the method, in the forming of the active layer, the active layer may be formed in such a manner as to have a thickness that is more than 0.5 μm and equal to or less than 2.0 μm.

In the method, in the performing of the selective etching, wet etching may be performed.

According to still another aspect of the present invention, there is provided a method of manufacturing a vertical field effect transistor.

The method includes: forming a source electrode on a substrate; patterning the source electrode; forming an active layer having columnar bundle-type grains on the patterned source electrode using an electrochemical deposition technique; forming a drain electrode on the active layer; forming a gate insulating layer on a lateral surface of the active layer; and forming a gate electrode on the gate insulating layer.

In the method, in the forming of the active layer, the electrochemical deposition technique may be used for an oxide semiconductor that is doped with a metal.

In the method, the metal with which the oxide semiconductor is doped may contain one or more selected from the group consisting of Sb, Pb, Ni, Cr, Co, Mn, and a combination thereof.

In the method, the oxide semiconductor may contain one or more selected from the group consisting of $Cu_2O$, ZnO, $SnO_2$, SnO, $In_2O_3$, $Zn_2SnO_4$, $InGaZnO_4$, $In_2Zn_3O_6$, $Zn_2SnO_4$, $ZnGa_2O_4$, $InGaO_3$, $In_2O_3$, $Ga_2O_3$, and a combination thereof.

In the method, in the forming of the active layer, the active layer may be formed in such a manner as to have a thickness that is more than 0.5 μm and equal to or less than 2.0 μm.

According to still another aspect of the present invention, there is provided a CMOS inverter.

The CMOS inverter includes: a PMOS in which the active layer of the vertical field effect transistor is formed of a P-type oxide semiconductor; and an NMOS in which the active layer of the vertical field effect translator is formed of an N-type oxide semiconductor.

In the inverter, the P-type oxide semiconductor of the PMOS may contain one or more selected from the group consisting of $Cu_2O$, ZnO, $SnO_2$, SnO, $In_2O_3$, $Zn_2SnO_4$, $InGaZnO_4$, $In_2Zn_3O_6$, $Zn_2SnO_4$, $ZnGa_2O_4$, $InGaO_3$, $In_2O_3$, $Ga_2O_3$, and a combination thereof.

In the inverter, the active layer of the PMOS and the active layer of the NMOS each may have a thickness that is more than 0.5 μm and equal to or less than 2.0 μm.

BRIEF DESCRIPTION OF THE DRAWINGS

FIG. 6A is a schematic view illustrating a state where the active layer is wet-etched in a case where a growth orientation of crystal grains is random.

FIG. 6B is a schematic view illustrating a state where the active layer having columnar bundle-type grains is wet-etched.

FIG. 6C is a SEM image showing a result of wet-etching the active layer in the case where the growth orientation of the crystal grains is random.

FIG. 6D is a SEM image showing a result of wet-etching the active layer having the columnar bundle-type grains.

DETAILED DESCRIPTION OF THE INVENTION

Figure 1:
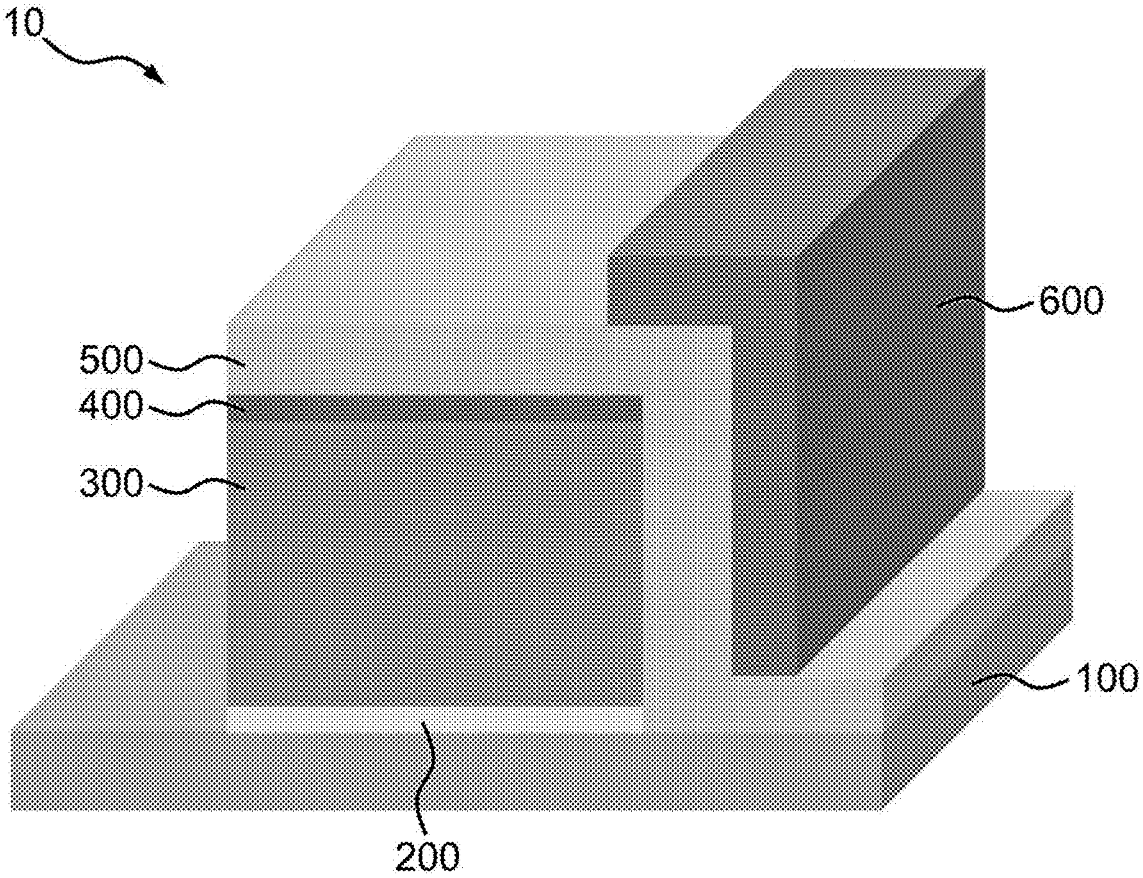
FIG. 1 is a view illustrating an image of a structure of a vertical field effect transistor according to a first embodiment.

The present invention will be described below with reference to the accompanying drawings. However, the present invention will be practiced in various different forms and is not limited to an embodiment described herein. In order to definitely describe the present invention, a constituent element of the present invention that is not associated with the description thereof is omitted from the drawings. The same constituent elements are given the same reference numeral through the present specification.

Throughout the present specification, a constituent element, when referred to as being "connected to" a different constituent element, may be "directly connected to" the different constituent element or may be "indirectly connected to" the different constituent element, with a third constituent element in between." In addition, unless specifically otherwise stated, the expression "includes a constituent element," this means that a different constituent element may be further included, not that a different constituent element is excluded.

Terms used throughout the present specification are only for describing a specific embodiment and are not intended to impose any limitation on the present invention. A noun in a singular has the same meaning as a noun in a plural form, unless nouns in singular and plural forms are definitely construed as having different meanings in context. The term "include," "have," or the like in the present specification is intended to indicate that a feature, a number, a step, an operation, a constituent element, a component, or a combination thereof, which is described in the present specification, is present, and thus should be understood not to preclude the possibility that one or more other features, numbers, steps, operations, constituent elements, components, or combinations thereof will be present or added.

An embodiment of the present invention will be described in detail below with reference to the accompanying drawings.

According to a first embodiment of the present invention, there is provided a vertical field effect transistor 10.

Figure 2A:
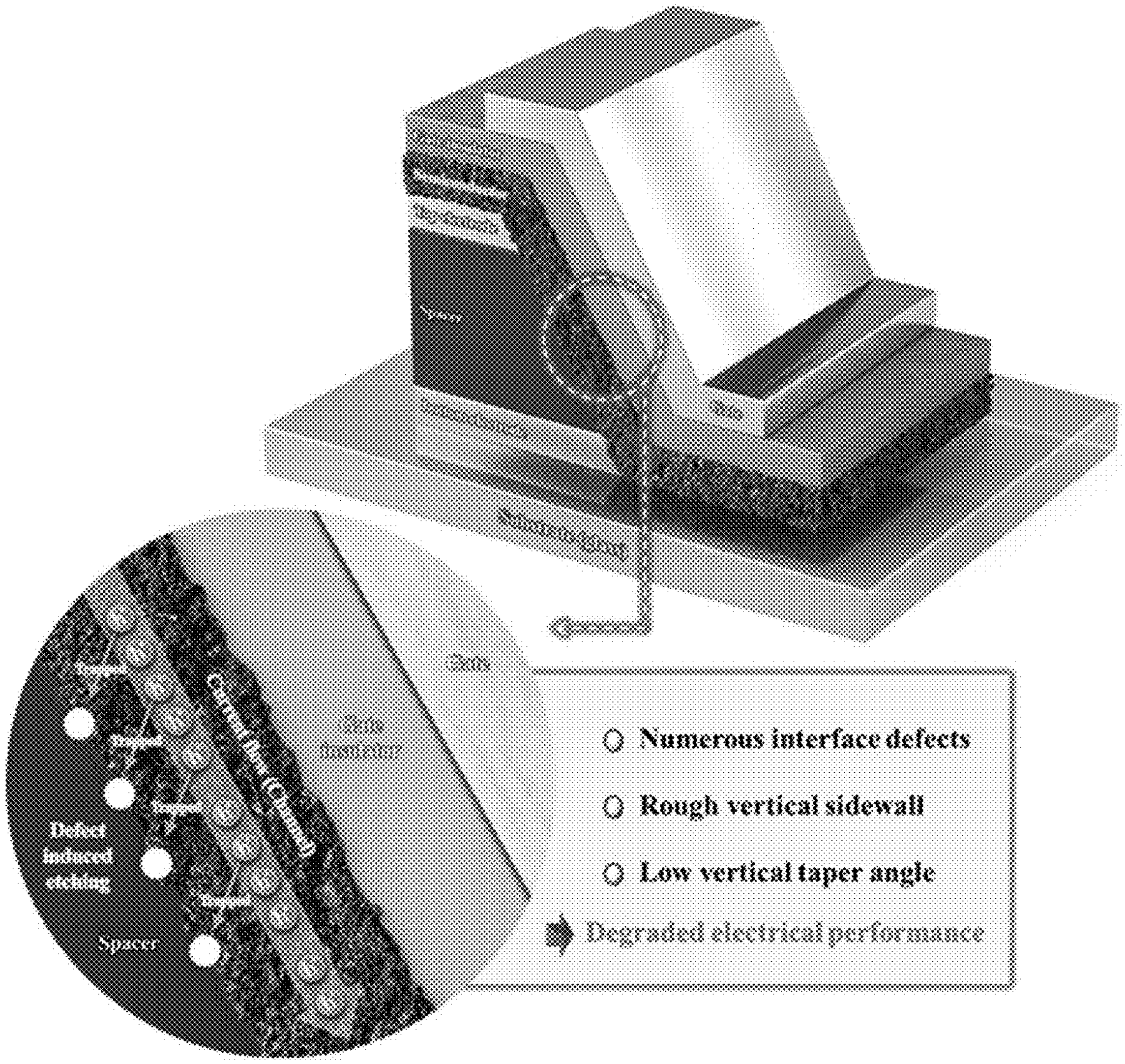
FIG. 2A is a view illustrating an image of a structure of a vertical field effect transistor in the related art for comparison in terms of channel and interface characteristics thereof.
Figure 2B:
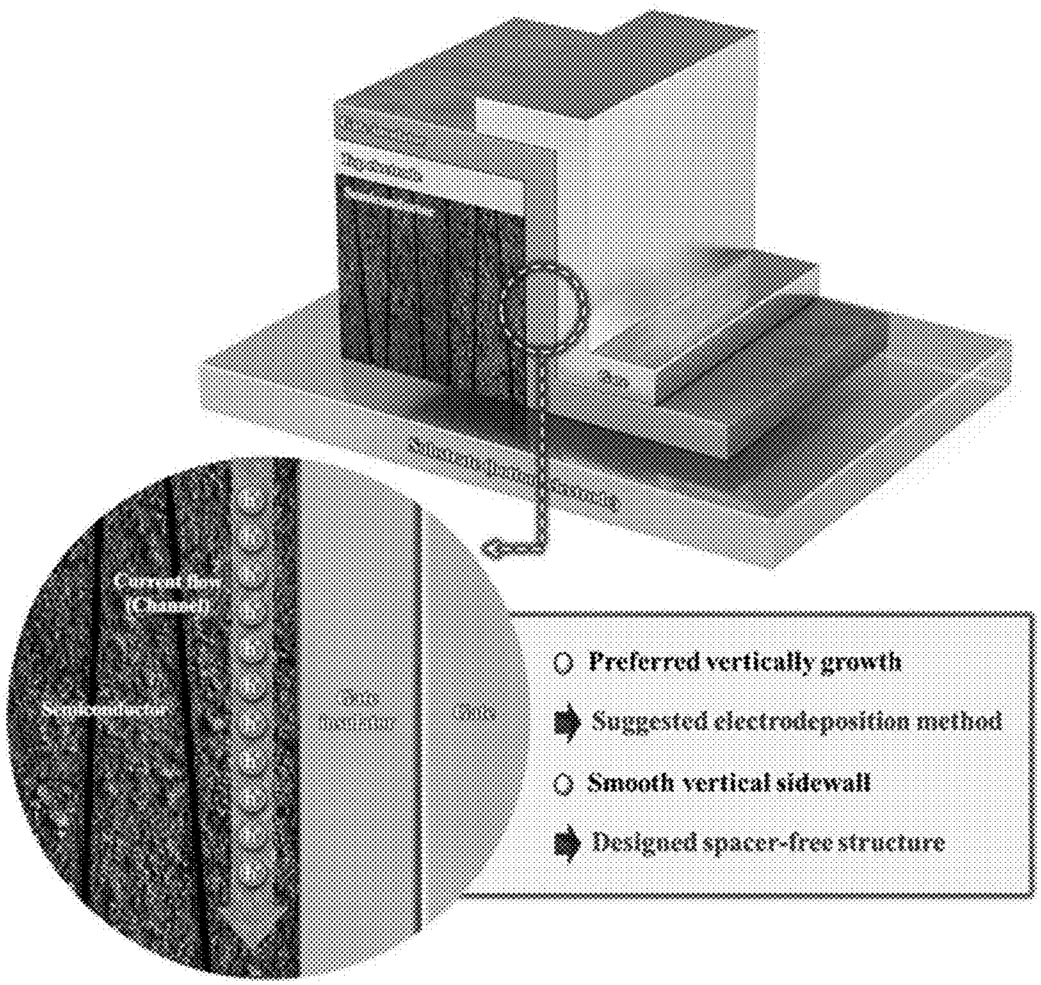
FIG. 2B is a view illustrating an image of the structure of the vertical field effect transistor according to the first embodiment for comparison in terms of channel and interfacial characteristics thereof.
Figure 3B:
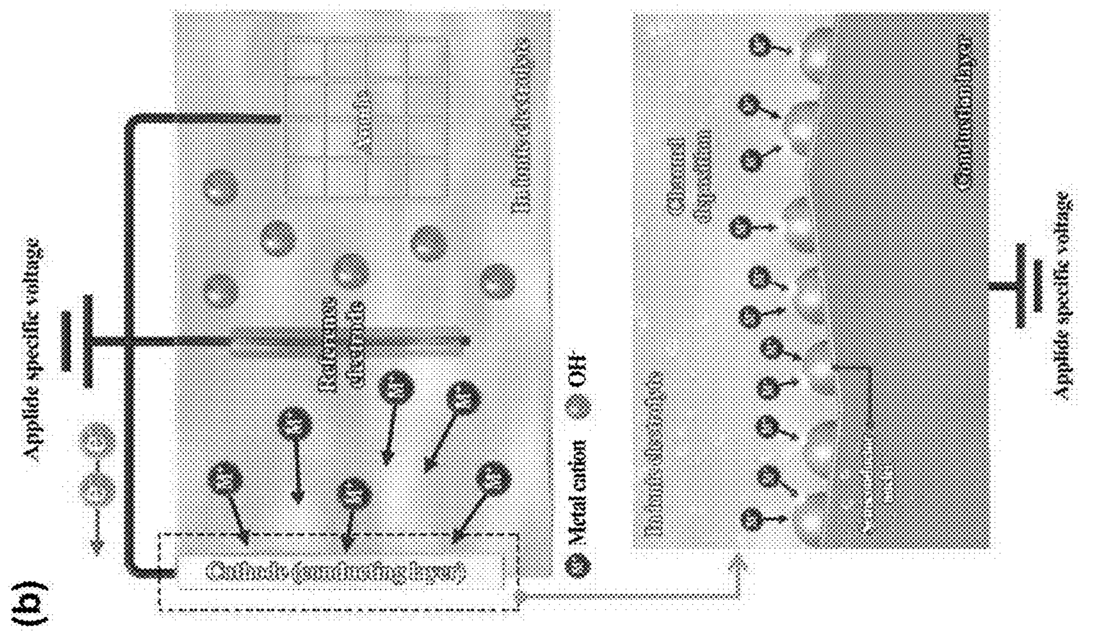
FIG. 3B is a schematic view for electrochemical deposition for a conductor in order to indicate the reason that the electrochemical deposition technique is not used in manufacturing the vertical field effect transistor in the related art.
Figure 3A:
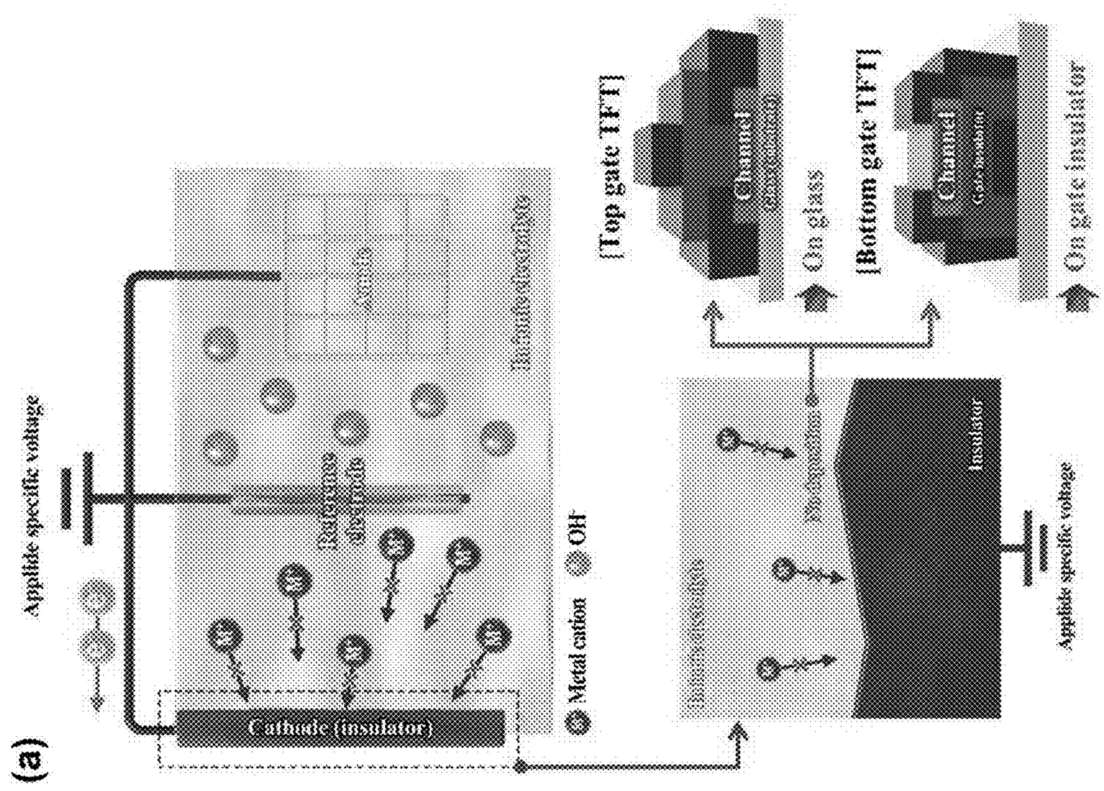
FIG. 3A is a schematic view for electrochemical deposition for an insulator in order to indicate the reason that an electrochemical deposition technique is not used in manufacturing the vertical field effect transistor in the related art.

FIG. 1 is a view illustrating an image of a structure of the vertical field effect transistor 10 according to the first embodiment. FIG. 2A is a view illustrating an image of a structure of a vertical field effect transistor in the related art for comparison in terms of channel and interfacial characteristics thereof. FIG. 2B is a view illustrating an image of the structure of the vertical field effect transistor 10 according to the first embodiment for comparison in terms of channel and interface characteristics thereof. FIG. 3A is a schematic view for electrochemical deposition for an insulator in order to indicate the reason that an electrochemical deposition technique is not used in manufacturing the vertical field effect transistor in the related art. FIG. 3B is a schematic view for electrochemical deposition for a conductor in order to indicate the reason that the electrochemical deposition technique is not used in manufacturing the vertical field effect transistor in the related art.

With reference to FIGS. 1 to 3B, the vertical field effect transistor 10 may include a substrate 100; a source electrode 200 positioned on the substrate 100; an active layer 300 positioned on the source electrode 200 and having a vertically grown crystal gain; a drain electrode 400 positioned on the active layer 300 to be spaced by the active layer 300 away from the source electrode 200; a gain insulating layer 500 positioned a lateral surface of the active layer 300, and a gate electrode 600 positioned on the gate insulating layer 500.

In the vertical field effect transistor 10, the substrate 100 means a substrate that is usually used for thin-film deposition. The substrate 100 according to the present invention may be configured to serve as a source electrode 200.

The substrate 100 may be one of a glass substrate, a plastic substrate, and a silicon substrate that are generally used.

The substrate 100, when it serves to the source electrode 200, may be formed of a conductive oxide, such as ITO (InSnO), IZO (InZnO), and AZO (AlZnO).

In the vertical field effect transistor 10, the source electrode 200 is positioned on the substrate 100. Positions of the source electrode 200 and the drain electrode 400 are interchangeable. The source electrode 200 may be formed at the position of the drain electrode 400, and vice versa.

The source electrode 200 may be formed in such a manner as to contain a conductive oxide, such as ITO (InSnO), IZO (InZnO), or AZO (AlZnO), a metal, such as Pt, Ru, Au, Ag, Mo, Al, W, or Cu, or the like.

When a voltage is applied to the gate electrode 600, the source electrode 200 serves to cause an electron or a hole, which is a carrier in a transistor, to flow to the drain electrode 400 along a channel formed in the active layer 300.

In the vertical field effect transistor 10, the active layer 300 is positioned on the source electrode 200. The structure of the vertical field effect transistor 10 in the related art is a structure in which a spacer is positioned on the source electrode 200 and in which the active layer 300 containing a channel is formed on a lateral surface of the source electrode 200, thereby connecting the source electrode 200 and the drain electrode 400 to each other. However, a structural feature of the present invention is that, without the spacer, the active layer 300 is positioned on the source electrode 200, thereby forming a channel connecting the source electrode 200 and the drain electrode 400 to each other.

The reason that the active layer 300 is not directly formed in the vertical field effect transistor 10 in the related art is described as follows. In a case where crystal grains of the active layer 300 are grown in a random orientation without being grown vertically, the channel connecting the source electrode 200 and the drain electrode 400 to each other is not formed. Even if the channel is formed, a large amount of leakage current occurs. Thus, the vertical field effect transistor 10 does not properly serve as a transistor.

Therefore, formation of an effective channel in which a limited amount of leakage current occurs and which connects the source electrode 200 and the drain electrode 400 to each other is a prerequisite for direct deposition of the active layer 300 without the spacer in the vertical field effect transistor 10.

In addition, the reason that in the vertical field effect transistor 10 in the related art, the active layer 300 of which the crystal grains are vertically grown cannot be formed with an electrochemical deposition technique that is a manufacturing technique that is employed according to the present invention is described with reference to FIGS. 3A and 3B. Research and development has focused on the structures of the top gate TFT and the bottom gate TFT in the related art in which the active layer 300 including the channel is formed on the insulator.

However, as illustrated in FIGS. 3A and 3B, the electrochemical deposition technique cannot apply to the insulator and is applicable only to a conductive material.

Therefore, the electrochemical deposition technique has not been considered to be possibly used to form the active layer 300 in the structures of the top gate TFT and the bottom gate TFT.

Consequently, it would not be easy for a person of ordinary skill in the art to conceive the technical idea of forming the active layer 300, of which the crystal grains are vertically grown, on the source electrode 200 using the electrochemical deposition technique. In this respect, the structure without the space that is proposed according to the present invention, an excellent electrical characteristic thereof, and an advantage thereof can be considered encouraging.

Next, the vertically grown crystal grains of the active layer 300 is described with reference to FIGS. 2A and 2B.

When the crystal grains are vertically grown in the active layer 300, the carrier flows between the source electrode 200 and the drain electrode 400 along the crystal grains. Therefore, the flow of the carrier is smooth, and a scattering effect of the carrier is minimized. Thus, the advantage that an electrical characteristic of the channel is stable can be achieved. In contrast, in the vertical field effect transistor 10 in the related art, the carrier undergoes a lot of scattering and trapping while flowing along the active layer 300. A remarkably smaller number of the electrons flow through a grain boundary more remarkably than in the first embodiment of the present invention.

Next, the active layer 300 may contain a p-type oxide semiconductor. However, the active layer 300 is not limited to the p-type oxide semiconductor because any material capable of being formed using the electrochemical deposition technique may be used as a material of the active layer 300. An n-type oxide semiconductor should also be interpreted as falling within the scope of the claimed present invention.

Specifically, the active layer 300 may contain one or more selected from the group consisting of $Cu_2O$, ZnO, $SnO_2$, SnO, $In_2O_3$, $Zn_2SnO_4$, $InGaZnO_4$, $In_2Zn_3O_6$, $Zn_2SnO_4$, $ZnGa_2O_4$, $InGaO_3$, $In_2O_3$, and $Ga_2O_3$.

In the first embodiment of the present invention, the active layer 300 is formed of $Cu_2O$. $Cu_2O$ is a material that is capable of being used for application of the electrochemical deposition technique. Particularly, $Cu_2O$ is regarded as an attractive photo-absorber that has very high photoelectric current, in the field of a photo-electrochemical cells (PECs) in which the vertical field effect transistor 10 according to the present invention finds application. Moreover, $Cu_2O$ is recyclable as a precursor and thus is economically advantageous in the field of PECs in which a low processing cost is required. $Cu_2O$ is adopted considering these respects and other factors.

In addition, ZnO, $SnO_2$, $In_2O_3$, $Zn_2SnO_4$, $InGaZnO_4$, $In_2Zn_3O_6$, $Zn_2SnO_4$, $ZnGa_2O_4$, $InGaO_3$, $In_2O_3$, and $Ga_2O_3$ that are proposed above are known as materials of which an n-type semiconductor is capable of being formed using the electrochemical deposition technique. It is obvious that these materials are also capable of being used in the first embodiment of the present invention.

Next, the feature of the present invention is that the active layer 300 has a thickness that is more than 0.5 μm and equal to or less than 2.0 μm. For example, in Experimental Example 1 in which measurements were made on the first embodiment of the present invention that was practiced using $Cu_2O$, in a case where the active layer 300 was formed in such a manner as to have a thickness of 0.5 μm or less, current flowed in a state where a transistor was turned off, and thus the transistor could not operate properly. Moreover, in a case where the active layer 300 was formed in such a manner as to have a thickness of more than 2.0 μm, field effect mobility is decreased, and thus a more improved characteristic did not appear than a transistor in the related art.

In the vertical field effect transistor 10, the drain electrode 400 is positioned on the active layer 300 and is positioned in such a manner as to be spaced by the active layer 300 away from the source electrode 200. Likewise, the positions of the source electrode 200 and the drain electrode 400 are interchangeable. The source electrode 200 may be formed at the position of the drain electrode 400, and vice versa.

The drain electrode 400 may be formed in such a manner as to contain a conductive oxide, such as ITO (InSnO), IZO (InZnO), or AZO (AlZnO), a metal, such as Pt, Ru, Au, Ag, Mo, Al, W, or Cu, or the like.

When a voltage is applied to the gate electrode 600, the drain electrode 400 serves to cause an electron or a hole, which is a carrier in a transistor, to flow to the source electrode 200 along the channel formed in the active layer 300.

In the vertical field effect transistor 10, the gate insulating layer 500 is positioned on the lateral surface of the active layer 300. With reference to FIG. 0.1, the gate insulating layer 500 may be positioned between the source electrode 200 and the gate electrode 600, between the active layer 300 and the gate electrode 600, and between the drain electrode 400 and the gate electrode 600.

The gate insulating layer 500 serves to block current from flowing between the gate electrode 600 and a channel formed in the active layer 300 and to transfer a voltage instead.

The gate insulating layer 500 may be formed of an insulating material that is used to form a normal semiconductor element. For example, the gate insulating layer 500 may be formed of a material, such as $HfO_2$ or $Al_2O_3$, that has a higher permittivity than $SiO_2$ or $SiO_2$.

In the vertical field effect transistor 10, the gate electrode 600 is positioned on the gate insulating layer 500. With reference to FIG. 1, the gate electrode 600 is positioned in a manner that faces the lateral surface of the active layer 300, with the gate insulating layer 500 in between.

The gate electrode 600 controls respective electrical characteristics of the source electrode 200 and the drain electrode 400.

The gate electrode 600 may be formed of a metal, as a conductive material, that is used as a material of a usual electrode, a conductive oxide, or the like. For example, the gate electrode 600 may be formed of a metal, such as Ti, Pt, Ru, Au, Ag, Mo, Al, W, or Cu, or a conductive oxide, such as ITO (InSnO), IZO (InZnO), or AZO (AlZnO).

Next, methods of manufacturing a vertical field effect transistor according to second and third embodiments, respectively, of the present invention is proposed. The second and third embodiments are different in order of etching from each other. First, the method of manufacturing the vertical field effect transistor according to the second embodiment of the present invention is described with reference to FIGS. 4 to 6D. A constituent element of the method according to the second embodiment of the present invention that is the same as a corresponding constituent element of the vertical field effect transistor 10 according to the first embodiment of the present invention should be interpreted as having the same meaning as the corresponding constituent element. The same description is not repeated. A configuration different from that of the vertical field effect transistor 10 is described.

Figure 4:
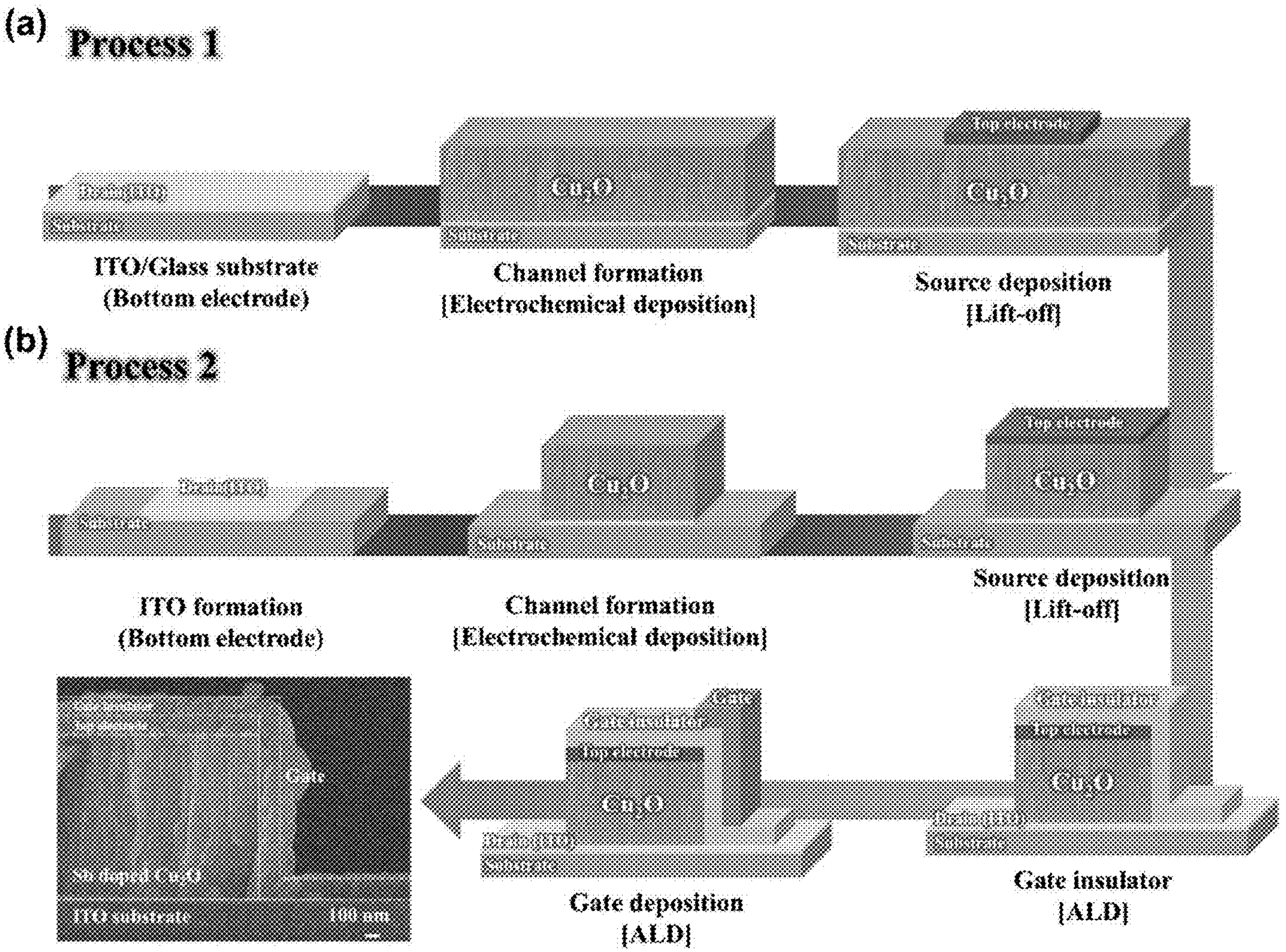
FIG. 4 illustrates (a) a method of manufacturing the vertical field effect transistor according to a second embodiment of the present invention, in which etching is performed after an upper drain electrode is formed, and (b) the method of manufacturing the vertical field effect transistor according to the second embodiment of the present invention, in which an active layer is formed after a lower source electrode is patterned.

FIG. 4 illustrates (a) a method of manufacturing the vertical field effect transistor according to a second embodiment of the present invention, in which etching is performed after an upper drain electrode is formed, and (b) the method of manufacturing the vertical field effect transistor according to the second embodiment of the present invention, in which an active layer is formed after a lower source electrode is patterned.

Figure 5:
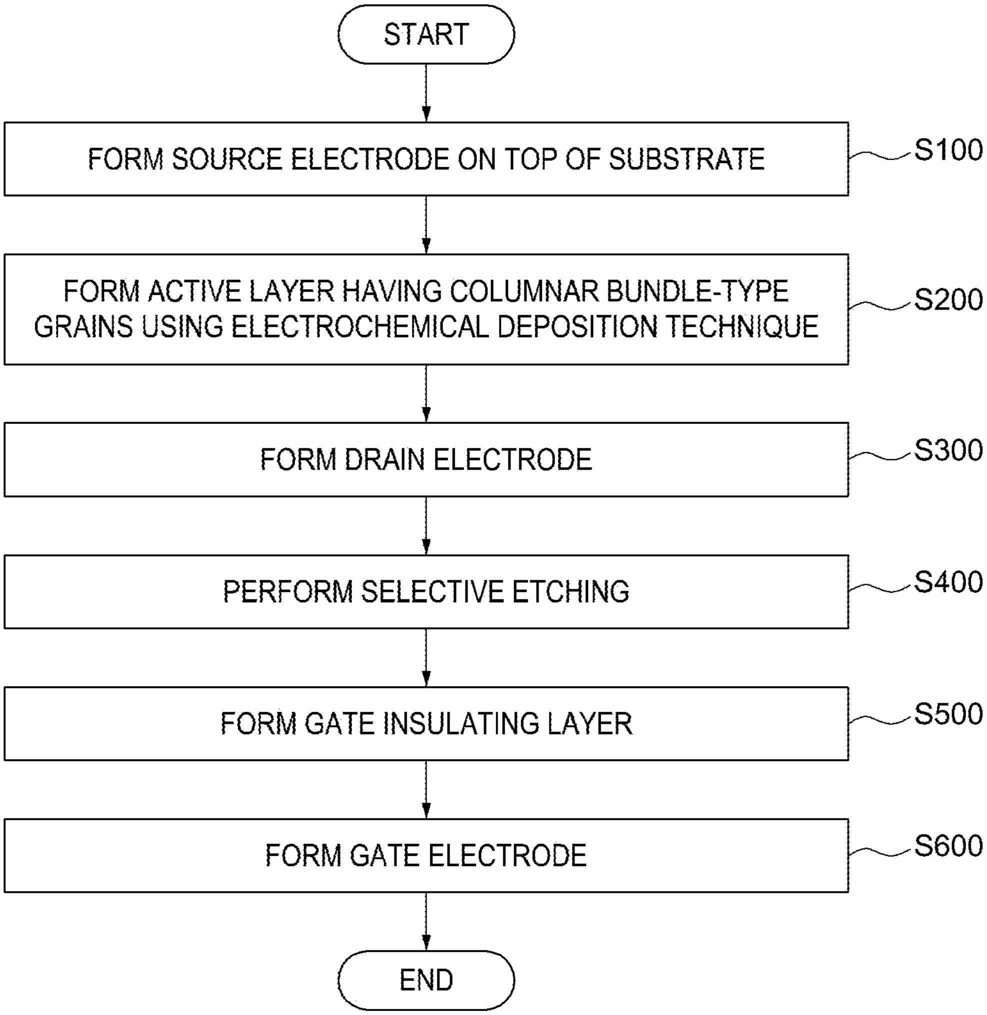
FIG. 5 is a flowchart illustrating the method of manufacturing the vertical field effect transistor according to the second embodiment of the present invention, in which the etching is performed after the upper drain electrode is formed.

FIG. 5 is a flowchart illustrating the method of manufacturing the vertical field effect transistor 10 according to the second embodiment of the present invention, in which the etching is performed after the upper drain electrode 400 is formed.

FIG. 6A is a schematic view illustrating a state where the active layer 300 is wet-etched in the case where the growth orientation of the crystal grains are random. FIG. 6B is a schematic view illustrating a state where the active layer 300 having columnar bundle-type grains is wet-etched. FIG. 6C is a SEM image showing a result of wet-etching the active layer 300 in the case where the growth orientation of the crystal grains is random. FIG. 6D is a SEM image showing a result of wet-etching the active layer 300 having the columnar bundle-type grains.

The method of manufacturing the vertical field effect transistor 10 may according to the second embodiment of the present invention include (i) Step S100 of forming the source electrode 200 on the substrate 100; (ii) Step S200 of forming the active layer 300, having the columnar bundle-type grains, on the source electrode 200 using the electrochemical deposition technique; (iii) Step S300 of forming the drain electrode 400 on the active layer 300; (iv) Step S400 of performing selective etching; (v) Step S500 of forming the gate insulating layer 500 on the lateral surface of the active layer 300; and (vi) Step S600 of forming the gate electrode 600 on the gate insulating layer 500.

In the method of forming the vertical field effect transistor 10, (i) Step S100, the source electrode 200 should be interpreted as being formed using techniques, normally employed to form the source electrode 200, which include sputtering, thermal evaporation, electron beam evaporation, atmosphere pressure CVD (APCVD), low-pressure CVD (LPCVD), plasma enhanced CVD (PECVD), atomic layer deposition (ALD), and the like.

In the method of manufacturing the vertical field effect transistor 10, in (ii) Step S200, the active layer 300 may be formed using the electrochemical deposition technique.

In (ii) Step S200, the electrochemical deposition technique may be used for an oxide semiconductor that is doped with a metal. A growth orientation of the oxide semiconductor may be determined with a voltage applied to the metal. It is possible that, according to purpose, an oxide semiconductor is grown in an orientation other than a vertical orientation in which the oxide semiconductor is formed according to the present invention.

With reference to FIGS. 6C and 6D, the oxide semiconductor that is not doped with a metal does not have a growth orientation. The lateral surface of the formed active layer 300 also has an angle of 50° or less. In the oxide semiconductor of which crystal grains do not have an orientation, as described above, the effective channel cannot be formed between the source electrode 200 and the drain electrode 400. Even if the effective channel is formed, a large amount of leakage current does not occur. Thus, the resulting transistor does not operate with effective performance. In addition, a sidewall having an angle of 50° or less and an uneven surface causes nonuniform etching during an etching process, and a surface thereof is damaged due to the etching process. Thus, the scattering or trapping of the carrier is caused at an interface of the side wall to the gate insulating layer 500 that is to be subsequently deposited.

In contrast, the oxide semiconductor doped with a metal has an orientation. It is possible that the oxide semiconductor is grown almost vertically as in the second embodiment of the present invention. Accordingly, the lateral surface of the active layer 300 has a vertical angle, and the active layer 300 also has the columnar bundle-type grains inside.

The vertical angle of the lateral surface of the active layer 300 remarkably decreases damage to a surface thereof during the etching process, thereby reducing the problem that the carrier is scattered or trapped at the interface to the gate insulating layer 500 formed on the lateral surface of the active layer 300. Consequently, the electrical characteristic appears more remarkably than when the oxide semiconductor is not doped with a metal.

In addition, since the columnar bundle-type grains are formed inside the active layer 300, a channel layer, as described above, is formed along the columnar bundle-type grains and also has an excellent electrical characteristic.

A specific manufacturing example will be described below under Manufacturing Example.

In addition, the formation of the columnar bundle-type grains inside the active layer 300 provides an advantage in terms of etching. This will be described in detail below in (iv) Step S400.

In (ii) Step S200, the metal with which the oxide semiconductor is doped using the electrochemical deposition technique means a conductive material that induces the growth of the oxide semiconductor according to the applied voltage when using the electrochemical deposition technique.

For example, the metal may contain one or more selected from the group consisting of Sb, Pb, Ni, Cr, Co, Mn, and a combination thereof. The metals with which the oxide semiconductor is to be doped are adopted because a problem of non-resistance of a p-type oxide can be solved by using a metal surfactant when an oxide is grown using the electrochemical deposition technique and because the growth orientation can be controlled by controlling an electrochemical initial growth behavior.

In (ii) Step S200, the oxide semiconductor that is doped using the electrochemical deposition technique may contain one or more selected from the group consisting of $Cu_2O$, ZnO, $SnO_2$, SnO, $In_2O_3$, $Zn_2SnO_4$, $InGaZnO_4$, $In_2Zn_3O_6$, $Zn_2SnO_4$, $ZnGa_2O_4$, $InGaO_3$, $In_2O_3$, $Ga_2O_3$, and a combination thereof.

Next, in (ii) Step S200, the active layer 300 may be formed in such a manner as to have a thickness that is more than 0.5 μm and equal to or less than 2.0 μm.

In the method of manufacturing the vertical field effect transistor 10, in (iv) Step S400, selective wet etching may be performed.

The reason for performing the wet etching in the method of manufacturing the vertical field effect transistor 10 according to the second embodiment of the present invention and an advantage thereof are described with reference to FIGS. 6A to 6D.

First, dry etching is used in manufacturing the vertical field effect transistor 10. The dry etching is problematic in terms of having a low selection ratio and damaging a surface of a thin film. Despite of this problem, the dry etching is performed in preference to the wet etching due to the spacer that is difficult to etch.

However, according to the present invention, the spacer is not included. Thus, an advantage of the wet etching can be utilized. However, with reference to FIGS. 6A to 6B, the wet etching is performed well at the grain boundary than at the crystal grains. Thus, it is difficult to form an intended vertical sidewall on the active layer 300 that has the crystal grains whose growth orientation is random.

According to the present invention, in order to solve this problem, the activation 300 that has vertically grown crystal grains inside is formed using the electrochemical deposition technique described above. Accordingly, as illustrated in FIG. 6B, the wet etching is strongly performed along the vertical grain boundary. As a result, the vertical formation of the sidewall is made possible, as in the SEM image in FIG. 6D.

According to the present invention, there can be provided the method of manufacturing the vertical field effect transistor 10 that has an excellent electrical characteristic as a result of forming the vertical side wall of the active layer 300 and at the same time remarkably reducing concern about damage to the active layer 300.

In the method of manufacturing the vertical field effect transistor 10, in (v) Step S500, the gate insulation layer 500 should be interpreted as being formed using techniques, normally employed to form the gate insulating layer 500, which include sputtering, thermal evaporation, electron beam evaporation, atmosphere pressure CVD (APCVD), low-pressure CVD (LPCVD), plasma enhanced CVD (PECVD), atomic layer deposition (ALD), and the like.

In the method of manufacturing the vertical field effect transistor 10, in (vi) Step S600, the gate electrode 600 should be interpreted as being formed using techniques, normally employed to form the gate electrode 600, which include sputtering, thermal evaporation, electron beam evaporation, atmosphere pressure CVD (APCVD), low-pressure CVD (LPCVD), plasma enhanced CVD (PECVD), atomic layer deposition (ALD), and the like.

Next, the method of manufacturing the vertical field effect transistor 10 according to the third embodiment of the present invention is described. The method of manufacturing the vertical field effect transistor 10 according to the third embodiment of the present invention will be described below with reference to FIGS. 4 to 7. A constituent element of the method according to the third embodiment of the present invention that is the same as a corresponding constituent element of the vertical field effect transistor 10 according to the first embodiment of the present invention and the same as a corresponding constituent element of the method of manufacturing the vertical field effect transistor 10 according to the third embodiment of the present invention should be interpreted as having the same meaning as the corresponding constituent elements. The same description is not repeated. A configuration different from that of the vertical field effect transistor 10 and from that of the method of manufacturing the vertical field effect transistor 10 is described.

FIG. 4 illustrates (a) a method of manufacturing the vertical field effect transistor according to a second embodiment of the present invention, in which etching is performed after an upper drain electrode is formed, and (b) the method of manufacturing the vertical field effect transistor according to the second embodiment of the present invention, in which an active layer is formed after a lower source electrode is patterned.

Figure 7:
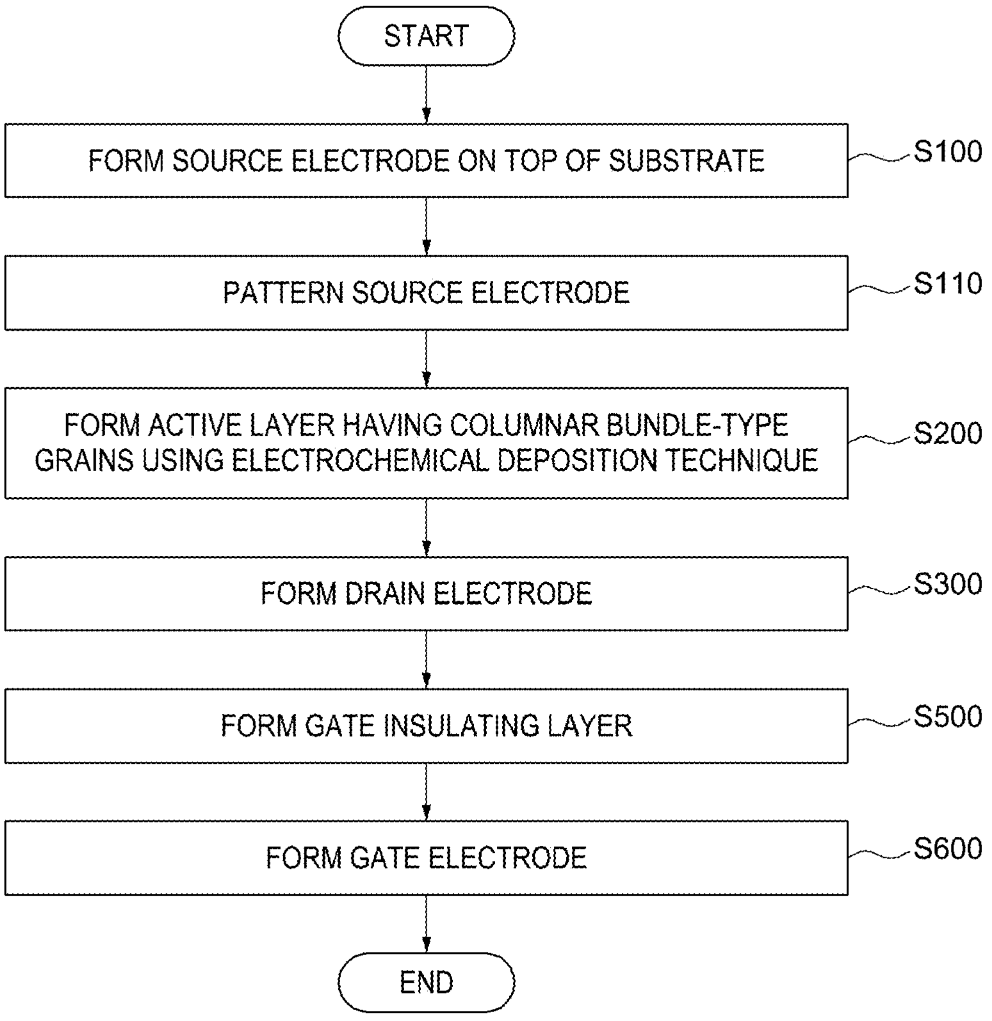
FIG. 7 is a flowchart illustrating a method of manufacturing the vertical field effect transistor according to a third embodiment of the present invention, in which the active layer is formed after the lower source electrode is patterned.

FIG. 7 is a flowchart illustrating the method of manufacturing the vertical field effect transistor 10 according to the third embodiment of the present invention, in which the active layer 300 is formed after the lower source electrode 200 is patterned.

The method of manufacturing the vertical field effect transistor 10 according to the third embodiment of the present invention may include (a) Step S100 of forming the source electrode 200 on the substrate 100; (b) Step S110 of patterning the source electrode 200; (c) Step S200 of forming the active layer 300, having the columnar bundle-type grains, on the patterned source electrode 200 using the electrochemical deposition technique; (d) Step S300 of forming the drain electrode 400 on the active layer 300; (e) Step S500 of forming the gate insulating layer 500 on the later surface of the active layer 300; and (f) Step S600 of forming the gate electrode 600 on the gate insulating layer 500.

The method of manufacturing the vertical field effect transistor 10 according to the third embodiment of the present invention is different in order of etching from the method of manufacturing the vertical field effect transistor 10 according to the third embodiment of the present invention.

In the method of manufacturing the vertical field effect transistor 10 according to the third embodiment of the present invention, the source electrode 200 is patterned, and then the active layer 300 is formed on the patterned source electrode 200.

The reason that the active layer 200 can be formed in this manner is because the active layer 300 can be formed using the electrochemical deposition technique in such a manner as to be deposited vertically on the source electrode 200 that is a conductive material. Therefore, when the source electrode 200 is first patterned and then the active layer 300 is formed on the patterned source electrode 200, a structure where the active layer 300 is not formed on an insulating portion other than the source electrode 200 can be realized.

When this is done, damage to a thin film due to additional etching does not occur because an etching process other than the etching process performed on the source electrode 200 is not performed in any complex structure. Consequently, the problem of an interfacial defective is remarkably reduced. Thus, it is possible to manufacture the vertical field effect transistor 10 that has excellent electrical characteristics, and at the same time, the process is simplified. An advantage in terms of yield and cost can be achieved.

In the method of manufacturing the vertical field effect transistor 10 according to the third embodiment of the present invention, in (c) Step S200, the oxide semiconductor that is doped with a metal is doped may be used for the electrochemical deposition technique.

The metal with which the oxide semiconductor is doped may contain one or more selected from the group consisting of Sb, Pb, Ni, Cr, Co, Mn, and a combination thereof.

In the method of manufacturing the vertical field effect transistor 10 according to the third embodiment of the present invention, in (c) Step S200, the oxide semiconductor that is doped using the electrochemical deposition technique may contain one or more selected from the group consisting of $Cu_2O$, ZnO, $SnO_2$, SnO, $In_2O_3$, $Zn_2SnO_4$, $InGaZnO_4$, $In_2Zn_3O_6$, $Zn_2SnO_4$, $ZnGa_2O_4$, $InGaO_3$, $In_2O_3$, $Ga_2O_3$, and a combination thereof.

Next, in the method of manufacturing the vertical field effect transistor 10 according to the third embodiment of the present invention, in (c) Step S200, the active layer 300 may be formed in such a manner as to have a thickness that is more than 0.5 μm and equal to or less than 2.0 μm.

Next, a CMOS inverter according to a fourth embodiment of the invention that includes the vertical field effect transistor 10 according to the first embodiment of the present invention is proposed. A constituent element of the CMOS inverter according to the fourth embodiment of the present invention that is the same as a corresponding constituent element of the vertical field effect transistor 10 according to the first embodiment of the present invention should be interpreted as having the same meaning as the corresponding constituent element. The same description is not repeated. A configuration different from that of the vertical field effect transistor 10 is described.

Figure 10A:
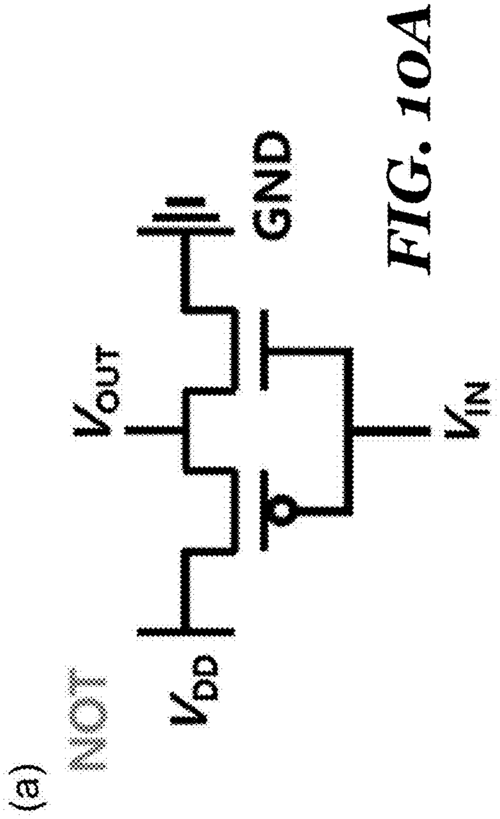
FIG. 10A is a circuit diagram of a CMOS inverter according to a fourth embodiment of the present invention.

FIG. 10A is a view illustrating a circuit of the CMOS inverter according to the fourth embodiment of the present invention.

With reference to FIGS. 10A, the CMOS inverter may include a PMOS in which the active layer 300 of the vertical field effect transistor 10 according to the first embodiment of the present invention is formed of a P-type oxide semiconductor; and an NMOS in which the active layer 300 of the vertical field effect transistor 10 according to the first embodiment of the present invention is formed of a N-type oxide semiconductor.

In this case, the P-type oxide semiconductor of the PMOS may contain $Cu_2O$, and the active layer 300 of the PMOS and the active layer 300 of the NMOS may have a thickness that is more than 0.5 μm and equal to or less than 2.0 μm.

In the CMOS inverter including the vertical field effect transistor 10, the P-type oxide semiconductor of the PMOS may contain one or more selected from the group consisting of $Cu_2O$, ZnO, $SnO_2$, SnO, $In_2O_3$, $Zn_2SnO_4$, $InGaZnO_4$, $In_2Zn_3O_6$, $Zn_2SnO_4$, $ZnGa_2O_4$, InGaO3, $In_2O_3$, $Ga_2O_3$, and a combination thereof.

Next, in the CMOS inverter including the vertical field effect transistor 10, the active layer 300 of the PMOS and the active layer 300 of the NMOS may have a thickness that is more than 0.5 μm and equal to or less than 2.0 μm.

Manufacturing Example 1

Manufacturing of the Active Layer Containing $Cu_2O$ that is Doped with Sb Using the Electrochemical Deposition Technique A general description of the vertical field effect transistor is omitted. A manufacturing condition of the active layer for achieving the advantage of the vertical field effect transistor according to the present invention is mainly described.

An electrochemical deposition process according to the present invention was performed at pH 10 to pH 12, at an applied voltage of −0.2 V to −0.5 V, and at a temperature of 60° C. to 60° C.

In addition, 1 mM to 3 mM of antimony (Sb) was used to induce vertical deposition of a $Cu_2O$ active layer.

Manufacturing Example 2

Manufacturing of a Vertical Field Effect Transistor with the Method of Manufacturing of the Vertical Field Effect Transistor according to the Present Invention A general description of transistor manufacturing is omitted. A process condition for achieving the advantage of the vertical field effect transistor according to the present invention is mainly described.

A condition for etching an active layer deposited in Manufacturing Example 1 is that wet etching is performed only on an active layer having columnar bundle-type grains when manufacturing the vertical field transistor by wet etching according to the present invention.

The wet etching was performed using an etching solution based on $H_2O_2$, and thus the active layer having a vertical slope was formed. The other manufacturing processes were performed in the same manner as when a transistor was normally manufactured.

Experimental Example 1

Figure 8A:
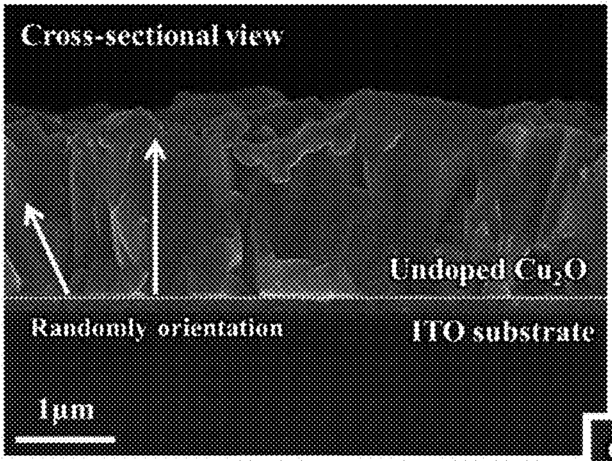
FIG. 8A is a SEM image showing a state where the active layer is grown from a copper oxide not doped with a metal, using an electrochemical deposition technique.
Figure 8B:
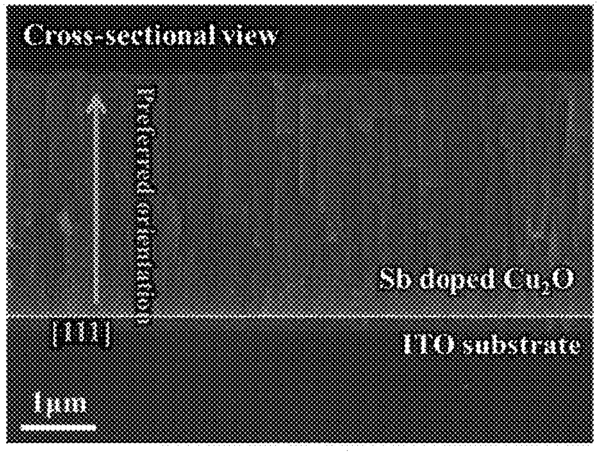
FIG. 8B is a SEM image showing a state where the active layer is grown from a copper oxide doped with a metal, using the electrochemical deposition technique.
Figure 8C:
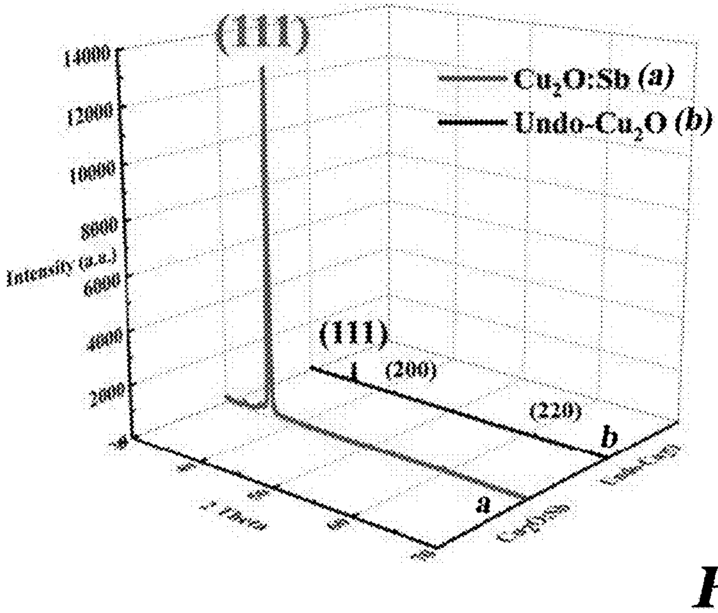
FIG. 8C is a graph showing results of X-ray analyzing and comparing of crystal faces of the copper oxides that are doped with a metal and not doped with a metal, respectively, using the electrochemical deposition technique.

X-Ray Diffraction Analysis of the Active Layer Containing Sb-Doped $Cu_2O$, Manufactured Using the Electrochemical Deposition Technique A description is provided with reference to FIGS. 8A to 8C.

FIG. 8A is a SEM image showing a state where the active layer is grown from a copper oxide not doped with a metal, using the electrochemical deposition technique. FIG. 8B is a SEM image showing a state where the active layer is grown from a copper oxide doped with a metal, using the electrochemical deposition technique. FIG. 8C is a graph showing results of X-ray analyzing and comparing of crystal faces of the copper oxides that are doped with a metal and not doped with a metal, respectively, using the electrochemical deposition technique.

The present experiment was conducted on a copper oxide, grown to a thickness of 1 μm, at pH 10, at an applied voltage of −0.5 V, and at a temperature of 60° C. in an electrolyte to which 2 mM of antimony (Sb) was added. The present experiment was made to analyze a crystal orientation of the copper oxide that was grown, according to whether or not the copper oxide was doped with a metal.

From FIGS. 8A and 8B, it can be seen that, unlike in the SEM image in FIG. 8A, in the SEM image in FIG. 8B, the active layer was grown during electrochemical growth because an initial nuclear density was increased due to Sb with which the copper oxide was doped.

From FIG. 8C, it can be seen that, in a case where the copper oxide was not doped with Sb, a crystal plane an orientation, but that, in a case where the copper oxide was doped with Sb, the active layer was grown vertically in a (111) plane orientation.

The result of the present experiment shows that the vertical field effect transistor according to the first embodiment of the present invention includes the active layer having vertically grown crystal grains. Accordingly, the channel that provides excellent carrier mobility is formed, and the problem of the interfacial defective is remarkably reduced. Thus, the first embodiment of the present invention has excellent electrical characteristics.

Experimental Example 2

Figure 9A:
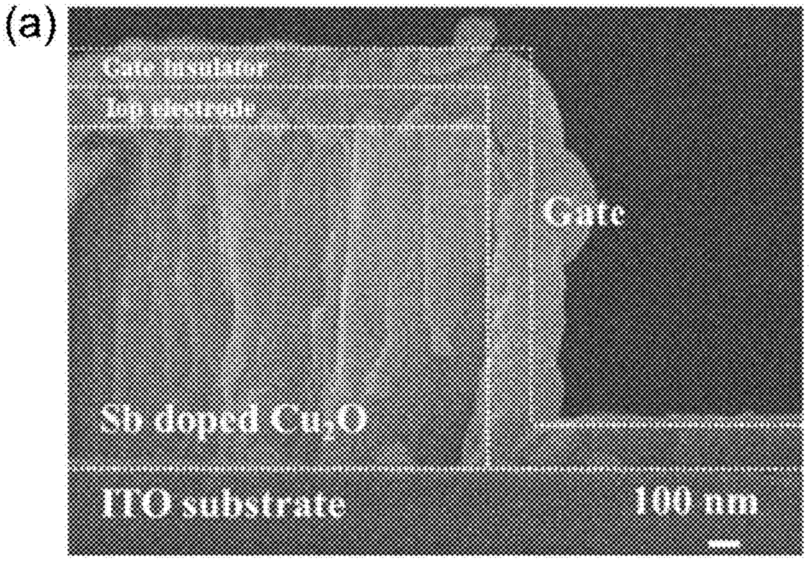
FIG. 9A is an SEM image of the vertical field effect transistor manufactured using copper oxide with the method of manufacturing the vertical field effect transistor according to the embodiment of the present invention.
Figure 9B:
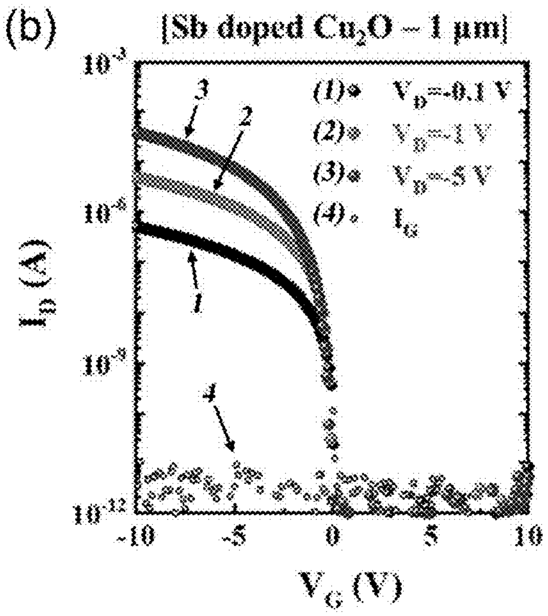
FIG. 9B is a graph showing results of measuring a historical phenomenon and an electric charge diffraction characteristic.
Figure 9C:
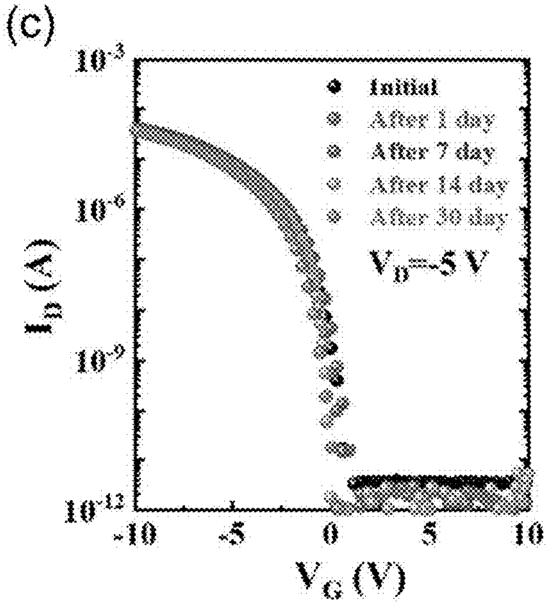
FIG. 9C is a graph showing results of measuring a change in performance of the manufactured vertical field effect transistor over time.

Experiment for Measurement of a Historical Phenomenon of the Vertical Field Effect Transistor Manufactured Using Copper Oxide with the Method of Manufacturing the Vertical Field Effect Transistor According to the Embodiment of the Present Invention and Measurement of Electric Charge Conduction Characteristic, and Experiment of a Change in Performance Over Time A description is provided with reference to FIGS. 9A to 9C.

FIG. 9A is an SEM image of the vertical field effect transistor manufactured using copper oxide with the method of manufacturing the vertical field effect transistor according to the embodiment of the present invention. FIG. 9B is a graph showing results of measuring a historical phenomenon and an electric charge diffraction characteristic. FIG. 9C is a graph showing results of measuring a change in performance of the manufactured vertical field effect transistor over time.

In the present experiment, the active layer was formed under the conditions described under Manufacturing Example 2, electrodes (a source electrode, a drain electrode, a gate electrode) were formed at a pressure of $6\times10^{-6}$ Torr using s sputtering technique, and fine electrode patterns were prepared by performing patterning by utilizing a photosensitizer.

In addition, the gate insulating layer was formed at a temperature of 150° C. using the atomic layer deposition (ALD) technique in order to secure an excellent electrical insulation characteristic, and an additional post-treatment process was not performed.

As illustrated in FIGS. 9A to 9C, the vertical field effect transistor, based on copper oxide (I), that is manufactured by the process proposed according to the present invention not only realizes a p-type transistor having an excellent electric charge conductivity without the historical phenomenon due to the vertical sidewall formed without interfacial damage, but also provides the advantage of being stable for a long time while maintaining a high-performance characteristic due to a high-quality formation film.

Experimental Example 3

Experiments for Measurement of Voltage Transfer Characteristics Varying with Application of Voltage by the CMS Inverter According to the Fourth Embodiment of the Present Invention and for Measurement of a Noise Margin Varying with an Input Voltage (Vin)

Figure 10B:
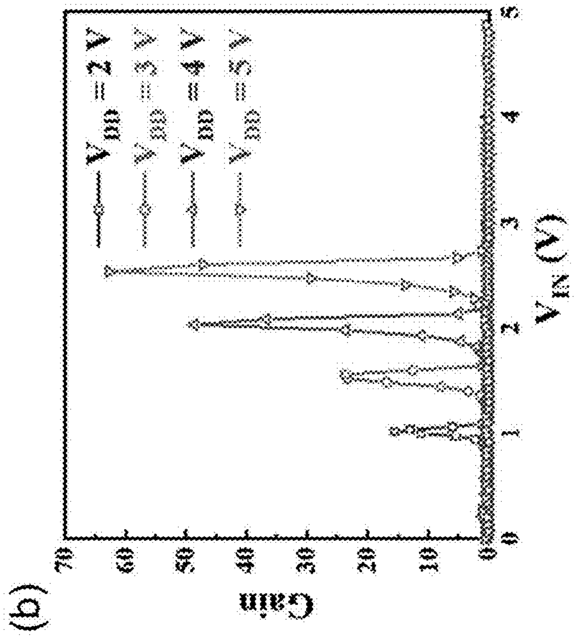
FIG. 10B is a graph on which data obtained by measuring voltage transfer characteristics varying with application of a voltage are plotted.
Figure 10C:
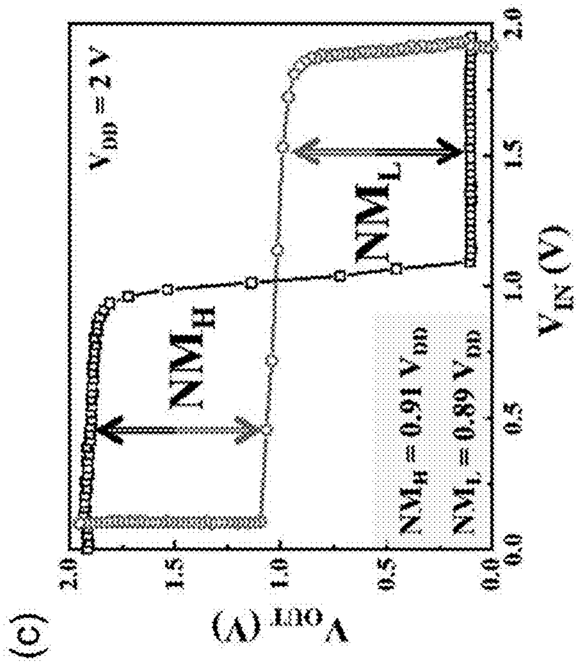
FIG. 10C is a graph on which data representing an input voltage (Vin) and an output voltage (Vout) into which a noise margin is converted are plotted.

A description is provided with reference to FIGS. 10A to 10C.

FIG. 10A is a circuit diagram of the CMS inverter according to the fourth embodiment of the present invention. FIG. 10B is a graph on which data obtained by measuring voltage transfer characteristics varying with application of a voltage are plotted. FIG. 10C is a graph on which data representing an input voltage (Vin) and an output voltage (Vout) into which a noise margin is converted are plotted.

In the present experiment, the CMOS inverter was prepared by interconnecting with a silver wire the PMOS, including the active layer, that was manufactured under the conditions mentioned under Manufacturing Example 2 and the planar-type NMOS that was manufactured by utilizing InGaZnO that was a typical n-type oxide semiconductor, for circuit connection.

The prepared CMOS inverter could realize a more excellent noise margin than a CMOS with nMOS-n+MOS in the related art.

Specifically, from FIGS. 10A to 10C, it can be seen that a high gain value was obtained due to CMOS voltage transfer characteristics that result from interconnecting the n-type semiconductor (NMOS) and the p-type semiconductor (PMOS).

In addition, an NMOS-off state and a PMOS-off state did not overlap, and thus, excellent voltage transfer characteristics appeared in a specific state (NMOS-off and PMOS-on) that was attained because the PMOS was poorer in performance than an NMOS in the related art. Accordingly, a noise margin close to a theoretical limit value (NM=VDD/2) could be realized.

Experimental Example 4

Experiment for Measurement of Positive and Negative Bias Stress of the Vertical Field Effect Transistor, Containing Copper Oxide, According to the First Embodiment of the Present Invention A description is described with reference to FIGS. 11A to 10C.

Figure 11A:
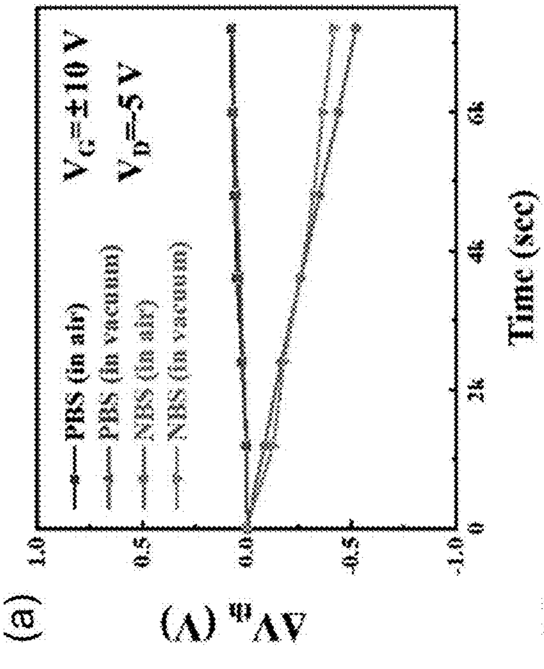
FIG. 11A is a graph showing results of measuring positive and negative bias stress on the vertical field effect transistor, containing copper oxide, according to the first embodiment of the present invention.
Figure 11B:
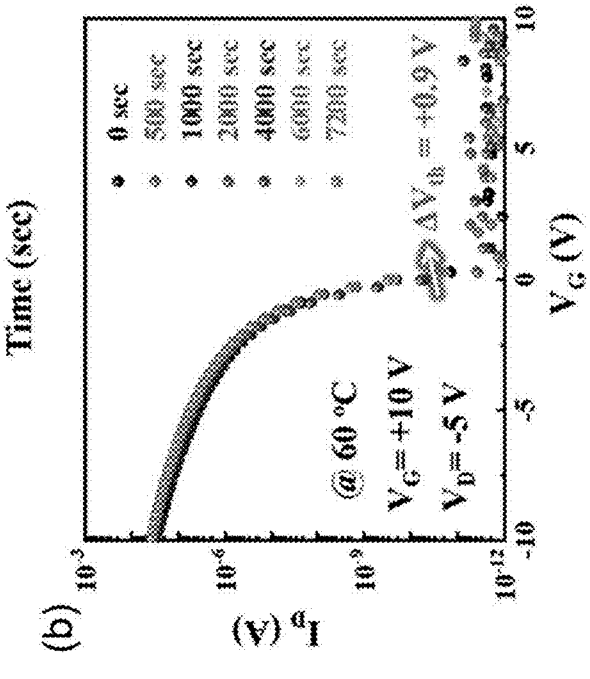
FIG. 11B is a graph showing results of performing positive bias measurement at a temperature of 60° C.
Figure 11C:
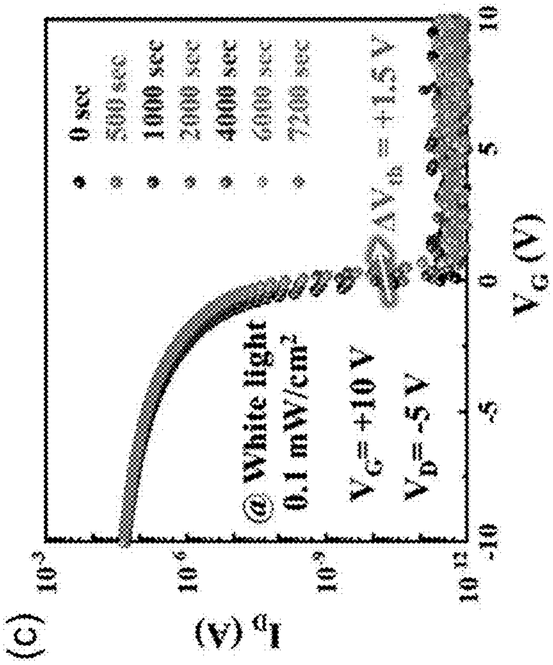
FIG. 11C is a graph showing results of performing the positive bias measurement under a white light emission condition.

FIG. 11A is a graph showing results of measuring the positive and negative bias stress on the vertical field effect transistor, containing copper oxide, according to the first embodiment of the present invention. FIG. 11B is a graph showing results of performing positive bias measurement at a temperature of 60° C. FIG. 11C is a graph showing results of performing the positive bias measurement under a white light emission condition.

The present experiment was made on the vertical field effect transistor manufactured in Manufacturing Example 2 in order to check element deterioration characteristics, in various stress atmospheres, specifically, in an environment where the active layer is exposed to the atmosphere and in an environment where a voltage is continuously applied.

Moreover, the present experiment was made on stability of the vertical field effect transistor with respect to light and thermal stability thereof.

From FIGS. 11A to 11C, it can be seen that most of the field effect transistors in which the p-type oxide semiconductor was as the active layer had unstable characteristics in various environments, but that the vertical field effect transistor in which copper oxide was used as the active layer according to the present invention secures excellent stability in various environments due to physical properties of the structurally improved p-type oxide semiconductor.

The results mentioned above show that the vertical field effect transistor, containing copper oxide, according to the present invention has the advantage of ensuring more excellent electrical, thermal, and optical stability due to the physical properties of the structurally improved p-type oxide semiconductor in various environments than the p-type oxide semiconductor in the related art.

Experimental Example 5

Figure 12A:
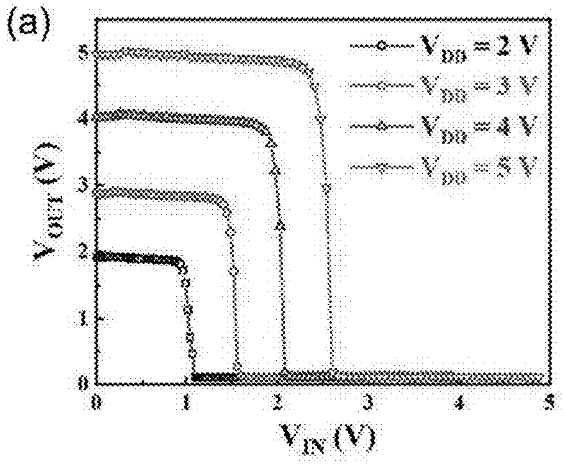
FIG. 12A is a graph on which data obtained by measuring voltage transfer characteristics of a CMOS inverter according to the fourth embodiment of the present invention that vary with application of a voltage are plotted.
Figure 12B:
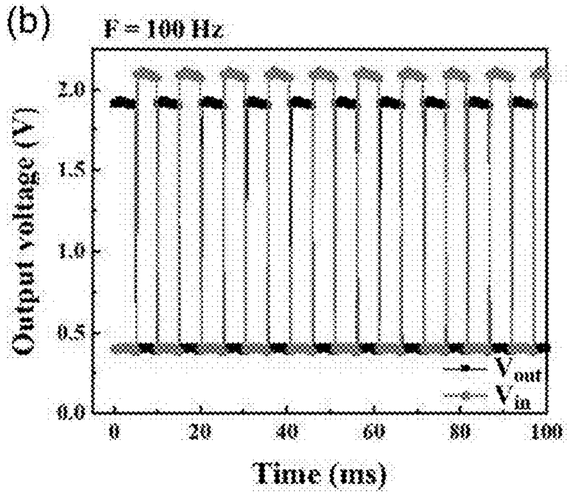
FIG. 12B is a graph on which data obtained by measuring a switching behavior at a frequency of 100 Hz are plotted.
Figure 12C:
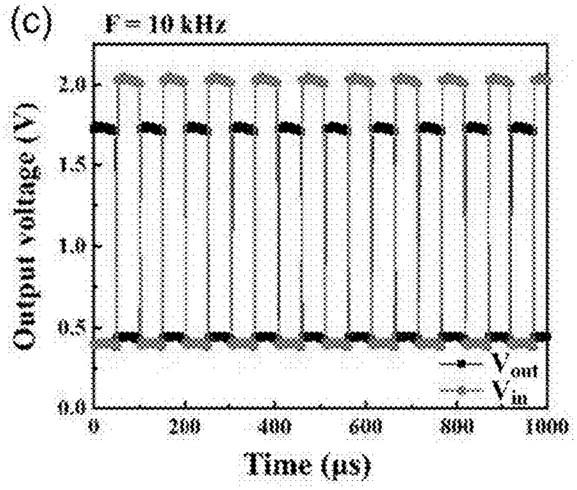
FIG. 12C is a graph on which data obtained by measuring a switching behavior at a frequency of 10 kHz condition are plotted.

Experiments for Measurement of the Voltage Transfer Characteristics of the CMOS Inverter According to the Fourth Embodiment of the Present Invention that Vary with Application of a Voltage and Measurement of Switching Behavior A description is provided with reference to FIGS. 12A to 12C.

FIG. 12A is a graph on which data obtained by measuring the voltage transfer characteristics of the CMOS inverter according to the fourth embodiment of the present invention that vary with application of a voltage are plotted. FIG. 12B is a graph on which data obtained by measuring a switching behavior at a frequency of 100 Hz are plotted. FIG. 12C is a graph on which data obtained by measuring a switching behavior at a frequency of 10 kHz are plotted.

From FIGS. 12A to 12C, it can be seen that the NMOS-off state and the PMOS-off state did not overlap by interconnecting the n-type semiconductor (NMOS) and the p-type semiconductor (PMOS), thereby minimizing a non-defined region (a region where the NMOS and the PMOS were both saturated, or a region other than an On/Off region), that excellent voltage transfer characteristics appeared even in a specific state (NMOS-off and PMOS-on) that was attained because the PMOS was poorer in performance than the NMOS in the related art, and that excellent switching behavior characteristics were realized even at a high frequency due to the PMOS that has improved characteristics.

The results mentioned above show that the CMOS inverter according to the fourth embodiment of the present invention has the advantage of not only minimizing the non-defined region by realizing the PMOS that has characteristic similar to those of the NMOS, but also realizing excellent switching behavior characteristics even at a high frequency.

Experimental Example 6

Figure 13A:
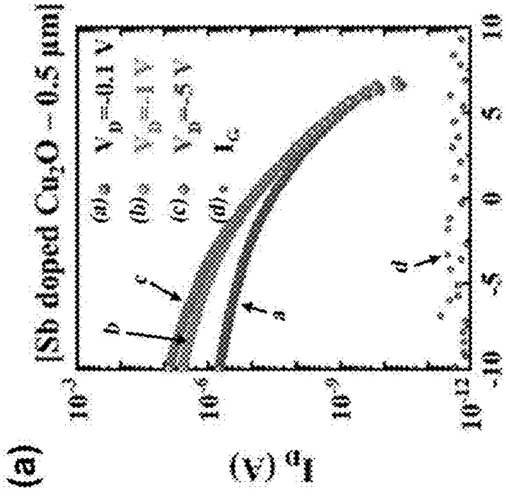
FIGS. 13A to 13C are graphs on which experimental data on performance of the vertical field effect transistor that varies with a thickness of the active layer are plotted.
Figure 13B:
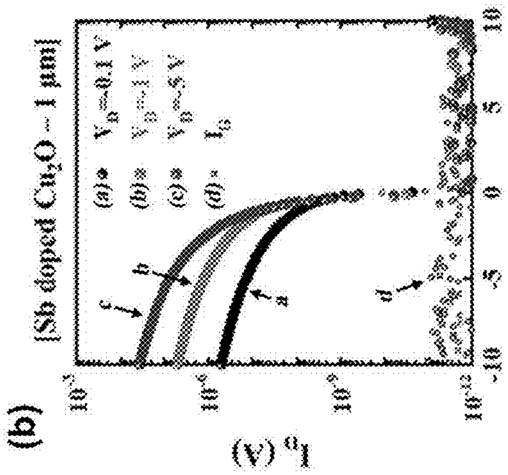
Figure 13C:
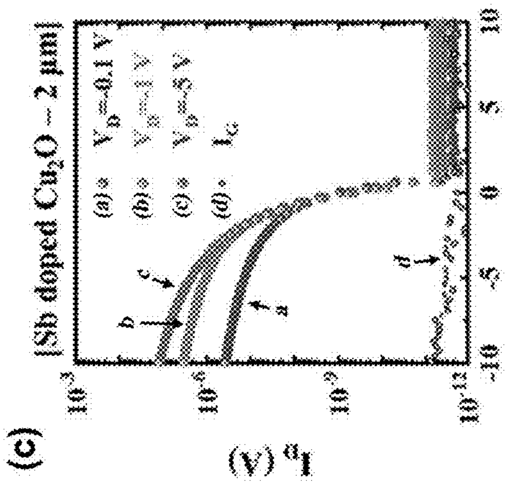

Experiment for Measurement of Performance Varying with the Thickness of the Active Layer of the Vertical Field Effect Transistor A description is provided with reference to FIGS. 13A to 13C.

FIGS. 13A to 13C are graphs on which experimental data on performance of the vertical field effect transistor that varies with the thickness of the active layer are plotted.

In the present experiment, a change in current that varied with an applied voltage was measured for the vertical field effect transistors that were manufactured in such a manner that the active layers had thicknesses of 0.5 μm, 1.0 μm, and 2.0 μm, respectively, with $Cu_2O$ being used as a material of the active layer.

From FIG. 13A, it can be seen that in a case where the active layer was formed in such a manner as to have a thickness of 0.5 μm or less, current flowed even in a state where the transistor was turned off, with the result that the transistor did not properly operate.

From FIGS. 13B and 13B, it can be seen that in a case where the active layer was formed in such a manner to have a thickness of more than 2.0 μm, field effect mobility was decreased, with the result that the vertical field effect transistor did not have more improved characteristics than the transistor in the related art.

The results show that in a case where in the vertical field effect transistor according to the present invention, $Cu_2O$ was used as a material of the active layer, the vertical field effect transistor had effective and excellent electrical characteristics when the active layer had a thickness that is more than 0.5 μm and equal to or less than 2.0 μm.

The vertical field effect transistor does not require a spacer, a spacer is not required and remarkably alleviates the problem that electric charge is scattered at an interface, thereby having excellent electrical characteristics.

In addition, the activation may be formed using the electrochemical deposition technique. With the electrochemical deposition technique, the active layer having vertically grown crystal grains may be formed, and a sidewall having a vertical slope may be formed.

In addition, due to the vertically grown crystal grains, a wet-etching process for etching may be performed to form the sidewall having the vertical slope. Moreover, this etching process is simple. Because the wet-etching process is performed, plasma damage that occurs when dry etching is performed can be prevented, and small, if any, damage occurs. Therefore, the vertical field effect transistor that has excellent interfacial characteristics and thus electrical characteristics and the method of manufacturing the vertical field effect transistor can be provided.

The present invention is limited to the above-mentioned effects. It should be understood that any other effect can be derived from a detailed description of the present invention or from constituent elements of the present invention that are recited in the claims.

The above-described embodiments of the present invention are exemplary. It would be understandable to a person of ordinary skill in the art to which the present invention pertains that a modification is possibly easily made to the above-described embodiments without any substantial change to the technical idea and the essential feature thereof. Therefore, the above-described embodiments should be understood as being exemplary and non-restrictive. For example, each constituent element that is individually described may be implemented in a distributed manner, and constituent elements that are separately described may be implemented in a combined form.

The scope of the present invention is defined in the following claims. All alterations or modifications that are derived from the meanings and the scope of the claims and that are equivalent to the above-described embodiments be interpreted as falling within the scope of the present invention.

DESCRIPTION OF REFERENCE NUMERALS

10: Vertical Field Effect Transistor
100: Substrate

200: Source Electrode
300: Active layer
400: Drain Electrode
500: Gate Insulating Layer
600: Gate Electrode

What is claimed is:

1. A vertical field effect transistor comprising:
a substrate;
a source electrode positioned on the substrate;
an active layer positioned on the source electrode and having vertically grown crystal grains;
a drain electrode positioned on the active layer in such a manner that the drain electrode is spaced away from the source electrode by the active layer;
a gate insulating layer positioned on a lateral surface of the active layer; and
a gate electrode positioned on the gate insulating layer,
wherein the active layer contains $Cu_2O$ and
wherein the vertically grown crystal grains of the active layer include columnar bundle-type grains grown in a (111) crystal plane orientation from the source electrode toward the drain electrode.

2. The vertical field effect transistor of claim 1, wherein the gate insulating layer is positioned between the source electrode and the gate electrode, between the active layer and the gate electrode, and between the drain electrode and the gate electrode.

3. The vertical field effect transistor of claim 1, wherein the active layer contains a p-type oxide semiconductor.

4. The vertical field effect transistor of claim 1, wherein the active layer has a thickness that is more than 0.5 μm and equal to or less than 2.0 μm.

5. A CMOS inverter comprising:
a PMOS in which the active layer of the vertical field effect transistor of claim 1 is formed of a P-type oxide semiconductor; and
an NMOS in which the active layer of the vertical field effect translator of claim 1 is formed of an N-type oxide semiconductor.

6. The CMOS inverter of claim 5, wherein the active layer of the PMOS and the active layer of the NMOS each have a thickness that is more than 0.5 μm and equal to or less than 2.0 μm.

* * * * *